United States Patent [19]

Swart

[11] Patent Number: 5,990,696

[45] Date of Patent: Nov. 23, 1999

[54] TEST FIXTURE WITH SELF CONTAINED SHORTING MEANS FOR TESTING SMALL SCALE TEST PACKS

[75] Inventor: Mark A. Swart, Anaheim Hills, Calif.

[73] Assignee: Delaware Capital Formation, Inc., Wilmington, Del.

[21] Appl. No.: 08/854,530

[22] Filed: May 12, 1997

Related U.S. Application Data

[63] Continuation of application No. 08/616,714, Mar. 15, 1996, abandoned.

[51] Int. Cl.⁶ .................................................. G01R 1/073
[52] U.S. Cl. ........................................ 324/761; 324/754
[58] Field of Search .................................. 324/761, 754, 324/755, 757, 762, 72.5, 537, 538

[56] References Cited

U.S. PATENT DOCUMENTS

| | | | |
|---|---|---|---|
| 3,068,403 | 12/1962 | Robinson | 324/72.5 |
| 4,004,843 | 1/1977 | Boenning et al. | 324/72.5 |
| 4,099,120 | 7/1978 | Aksu | 324/761 |
| 4,340,860 | 7/1982 | Teeple, Jr. | 324/537 |
| 4,899,104 | 2/1990 | Maelzer et al. | 324/158 |
| 5,654,646 | 8/1997 | Kit | 324/754 |

FOREIGN PATENT DOCUMENTS

| | | |
|---|---|---|
| 2178604A | 2/1987 | United Kingdom . |
| 2249639A | 5/1992 | United Kingdom . |
| 2265224A | 9/1993 | United Kingdom . |
| 2278965A | 12/1994 | United Kingdom . |

OTHER PUBLICATIONS

IBM Technical Disclosure Bulletin, vol. 35, No. 7, Dec. 1992, Combination Test Adapter, pp. 164–165.

*Primary Examiner*—Ernest Karlsen
*Attorney, Agent, or Firm*—Christie, Parker & Hale, LLP

[57] ABSTRACT

A printed circuit board tester has a pattern of test probes on a base upon which a translator fixture is mounted. The translator fixture includes a plurality of essentially parallel and vertically spaced apart rigid translator plates having selected patterns of holes containing translator pins for contacting test points on a printed circuit board supported at one end of the translator fixture. The pins translate electrical test signals between test points on the printed circuit board and the test probes on the base of the tester. The fixture includes a retractable shorting plate extending through a top plate of the fixture capable of being pressed into shorting contact with small scale test packs on the printed circuit board, preferably by a pneumatic cylinder position within the fixture. A base receptacle is rigidly secured to a base plate of the fixture for releasably attaching the cylinder within the fixture. The shorting plate includes a layer of conductive rubber for shorting the test pads within the test pack.

12 Claims, 4 Drawing Sheets

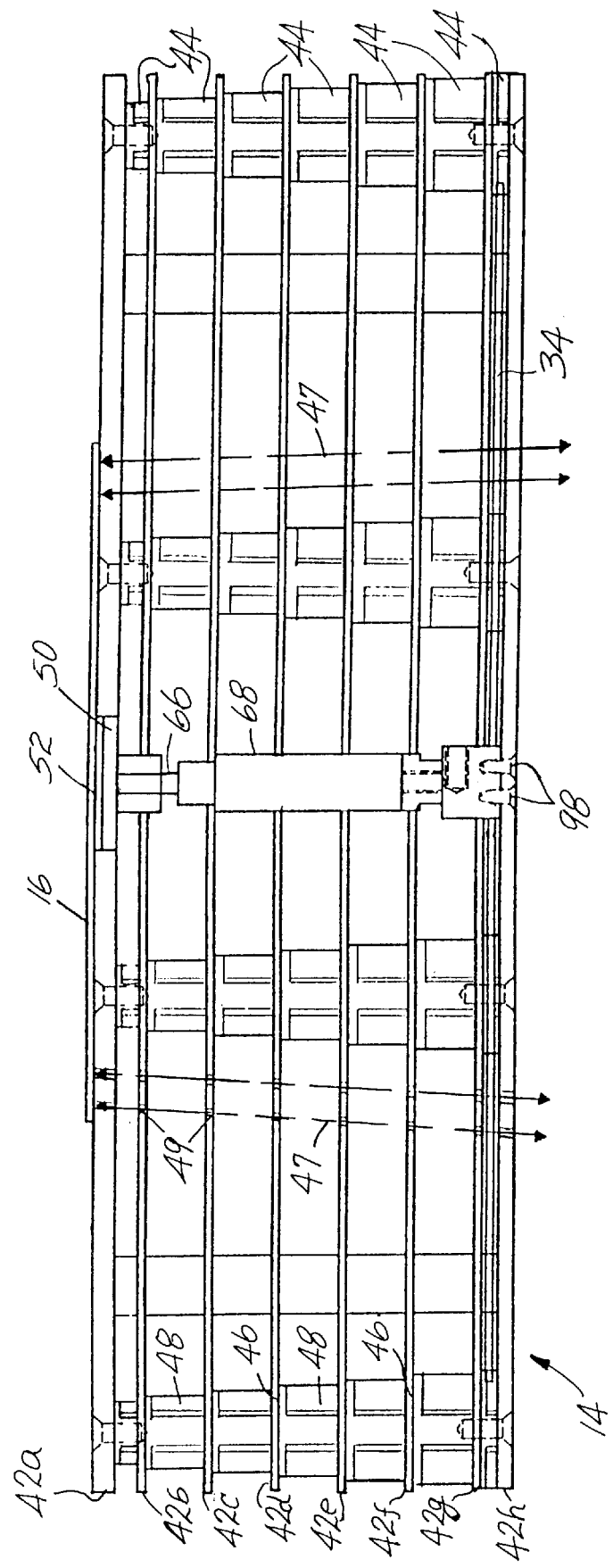

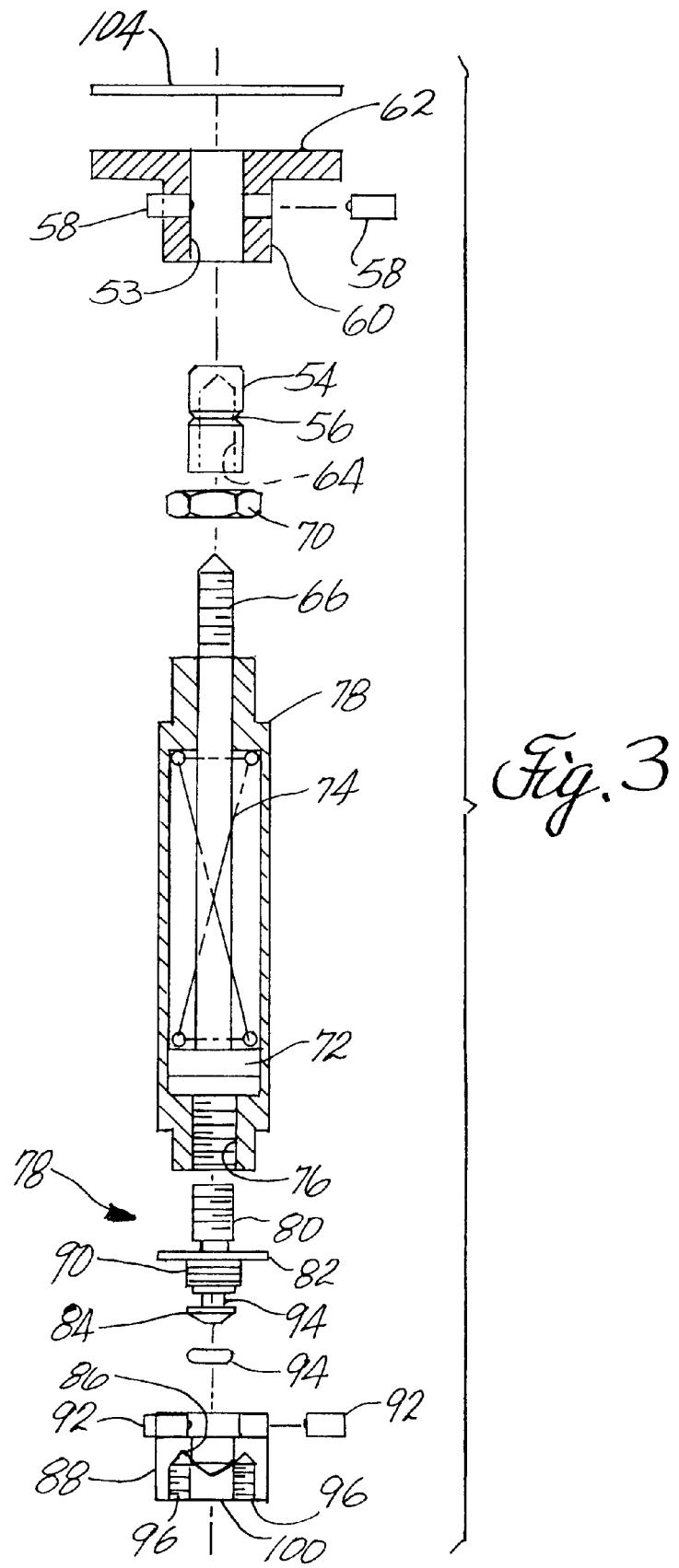

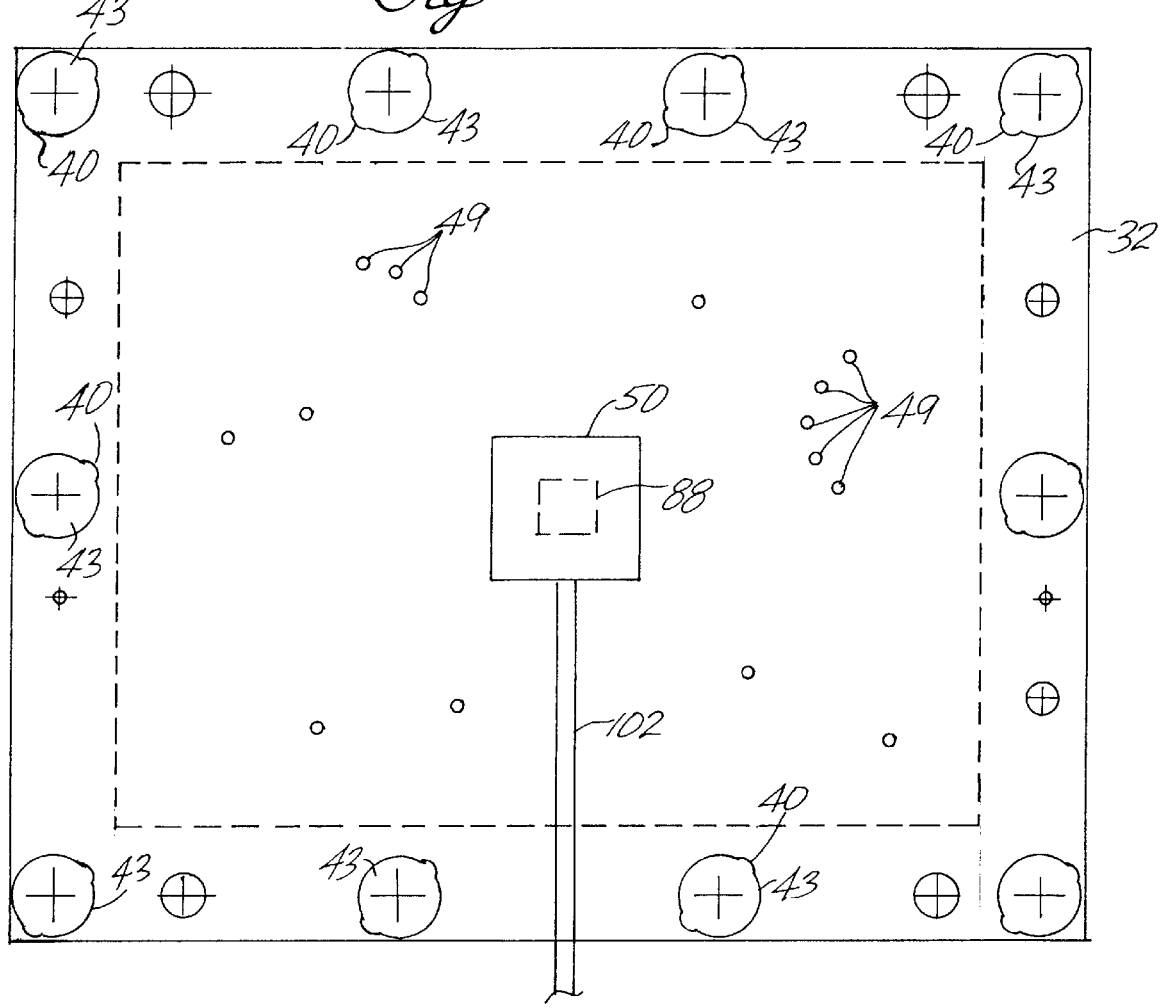

TEST FIXTURE WITH SELF CONTAINED SHORTING MEANS FOR TESTING SMALL SCALE TEST PACKS

CROSS-REFERENCE TO RELATED APPLICATION

This is a continuation of application Ser. No. 08/616,714, filed Mar. 15, 1996, now abandoned.

FIELD OF THE INVENTION

This invention relates to the automatic testing of bare printed circuit boards, and more particularly, to a translator fixture for translating test signals from a board under test to a pattern of test probes in a tester having a pneumatic cylinder positioned in the fixture for testing small scale test packs on the circuit board.

BACKGROUND OF THE INVENTION

Automatic test equipment for checking printed circuit boards has long involved use of a "bed of nails" test fixture in which the circuit board is mounted during testing. This test fixture includes a large number of nail-like spring-loaded test probes arranged to make electrical contact under spring pressure with designated test points on the circuit board under test, also referred to as the unit under test or "UUT." Any particular circuit laid out on a printed circuit board is likely to be different from other circuits, and consequently, the bed of nails arrangement for contacting test points in the board must be customized for that particular circuit board. When the circuit to be tested is designed, a pattern of test points to be used in checking it is selected, and a corresponding array of test probes is configured in the test fixture. This typically involves drilling a pattern of holes in a probe plate to match the customized array of test probes and then mounting the test probes in the drilled holes on the probe plate. The circuit board is then mounted in the fixture superimposed on the array of test probes. During testing, the spring-loaded probes are brought into spring-pressure contact with the test points on the circuit board under test. Electrical test signals are then transferred from the board to the test probes and then to the exterior of the fixture for communication with a high speed electronic test analyzer which detects continuity or lack of continuity between various test points in the circuits on the board.

Various approaches have been used in the past for bringing the test probes and the circuit board under test into pressure contact for testing. One class of these fixtures is a "wired test fixture" in which the test probes are individually wired to separate interface contacts for use in transmitting test signals from the probes to the external electronically controlled test analyzer. These wired test fixtures are often referred to as "vacuum test fixtures" since a vacuum is applied to the interior of the test fixture housing during testing to compress the circuit board into contact with the test probes. Customized wired test fixtures of similar construction also can be made by using mechanical means other than vacuum to apply the spring force necessary for compressing the board into contact with the probes during testing.

The wire-wrapping or other connection of test probes, interface pins and transfer pins for use in a wired test fixture can be time intensive. However, customized wired test fixtures are particularly useful in testing circuit boards with complex arrangements of test points and low-volume production boards where larger and more complex and expensive electronic test analyzers are not practical.

As mentioned previously, the customized wired test fixtures are one class of fixtures for transmitting signals from the fixture to the external circuit tester. A further class of test fixtures is the so-called "dedicated" test fixtures, also known as a "grid-type fixture," in which the random pattern of test points on the board are contacted by translator pins which transfer test signals to interface pins arranged in a grid pattern in a receiver. In these grid-type testers, fixturing is generally less complex and simpler than in the customized wired test fixtures.

A typical dedicated or grid fixture contains test electronics with a huge number of switches connecting test probes in a grid base to corresponding test circuits in the electronic test analyzer. In one embodiment of a grid tester as many as 40,000 switches are used. When testing a bare board on such a tester, a translator fixture supports translator pins that communicate between a grid pattern of test probes in a grid base and an off-grid pattern of test points on the board under test. In one prior art grid fixture so-called "tilt pins"" are used as the translator pins. The tilt pins are straight solid pins mounted in corresponding pre-drilled holes in translator plates which are part of the translator fixture. The tilt pins can tilt in various orientations to translate separate test signals from the off-grid random pattern of test points on the board to the grid pattern of test probes in the grid base.

Translator fixtures can be constructed and assembled with a plurality of translator plates made from a plastic material such as Lexan. The translator plates are stacked in the fixture between corresponding sets of spacers aligned with one another vertically to form "stand-offs" spaced apart around the periphery of the fixture. The spacers hold the translator plates in a fixed position spaced apart vertically from one another and reasonably parallel to each other. The translator plates at each level of the fixture have pre-drilled patterns of alignment holes that control the position of each tilt pin in the translator fixture.

Several problems are associated with these types of test fixtures when the test points on the printed circuit board are positioned very closely together and are very thin. Individual test points are commonly referred to as test pads, and a group of test pads are commonly known as a test pack. When the tilt pins contact very thin test pads, the pads can be crushed or bent by the tilt pins. Depending upon the degree of damage to the test pads, and how closely they are positioned, individual pads can be permanently shorted together during testing.

A second problem occurring with these types of test fixtures is the difficulty in achieving accurate test results for a test pack when the pads are very closely spaced. It becomes very difficult to direct a tilt pin to each pad within the pack when the pads are so closely spaced. Slight misalignments of test pins can affect the test results, reducing test accuracy.

A third problem is encountered for packs having a grid density of pads which is greater than the grid density of the test probes, such as when the test pack is formed as a ball grid array (BGA). In such instances there are not enough translation pins available for testing each test pad and through testing of the pack is not possible.

Consequently, a need exists for a printed circuit board test fixture capable of accurately and safely testing circuit boards having small scale test packs.

SUMMARY OF THE INVENTION

Briefly, one embodiment of this invention comprises a translator fixture for a printed circuit board tester of the type having a pattern of test probes on a base upon which the translator fixture is mounted. The translator fixture comprises a plurality of essentially parallel and vertically spaced apart rigid translator plates having selected patterns of pre-drilled holes for supporting translator pins for contacting test points on a printed circuit board supported on one side of the translator fixture. The translator pins translate electrical test signals between test points on the printed circuit board and the test probes at the base of the tester. The translator fixture includes a plurality of spaced apart translator plate stacking towers of identical construction supporting the translator plates in their fixed positions in the translator fixture. The different translator plates are mounted on the stacking towers at predetermined levels in the fixture, and each translator plate has a specific pattern of pre-drilled holes for mounting the translator pins in the necessary orientations in the fixture.

A pneumatically actuated shorting plate is positioned in the fixture corresponding to the location on the printed circuit board where a group of very closely spaced test points are to be tested. A hole is cut through the upper translator plates corresponding to the dimension of the shorting plate to allow the shorting plate to engage the unit under test. A layer of compliant conductive media is positioned over the upper surface of the shorting for electrical connection to the test points. The shorting plate includes a snap fitting for attachment to an air cylinder extending downwardly through the layers of translator plates. The air cylinder is attached at the bottom of the fixture by a base plug which snaps into a base receptacle rigidly secured to a lower translator plate of the fixture.

During testing of the unit under test, the air cylinder is energized, raising the shorting plate into contact with the test pack, effectively shorting them together for testing without bending or damaging the test points.

These and other aspects of the invention will be more fully understood by referring to the following detailed description and the accompanying drawings.

BRIEF DESCRIPTION OF THE DRAWINGS

FIG. 2 is a fragmentary, semi-schematic side elevational view illustrating a translator fixture constructed and assembled according to principles of this invention;

FIG. 3 is an exploded cross-sectional view of a shorting assembly contained in the fixture shown in FIG. 2; and;

FIG. 4 is a top view of the base plate of the translator fixture of FIG. 2.

DETAILED DESCRIPTION

Figure 1:
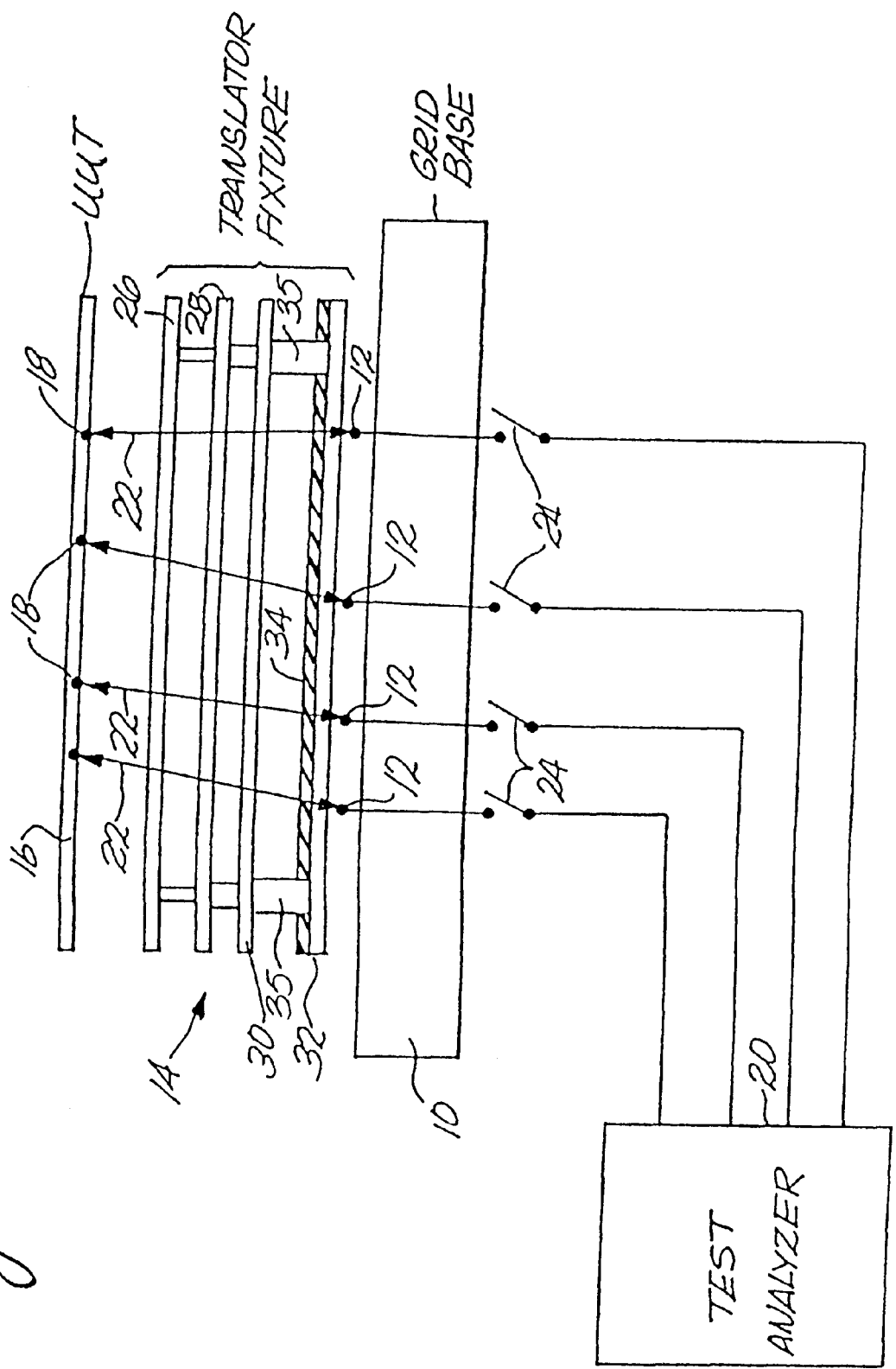
FIG. 1 is a schematic block diagram illustrating components of a dedicated or grid type tester and a translator fixture constructed and assembled according to principles of this invention.

Referring to the schematic block diagram of FIG. 1, a grid-type printed circuit board tester includes a grid base 10 having an array of spring-loaded test probes 12 arranged on a two-dimensional grid pattern. The test probes illustrated schematically in FIG. 1 preferably comprise an orthogonal array of uniformly spaced-apart rows and columns of test probes which may be aligned on 100 mil centers as an example. The spring-loaded plungers of the test probes 12 project above the surface of the grid base uniformly across the array of probes. A translator fixture 14 supports a printed circuit board 16 under test (also referred to as a "unit under test" or UUT"). The translator fixture serves as an interface between an array of test points 18 on the board under test and the test probes 12 in the grid base 10. The translator fixture is the subject of this invention and is described in more detail below. An external electronic test analyzer 20 is electrically connected to the test points in the board under test through test pins in the translator fixture. These test pins (of which there can be several types) are illustrated generally at 22.

The test analyzer 20 contains electronic interrogation circuits to electronically interrogate separate test points 18 of the board under test in order to determine whether or not an electrical connection exists between any two given test points. The electrical connections detected between test points on the tested board are electronically compared with stored reference results obtained from a previous interrogation of test points of a faultless master printed circuit board. The tested board is good if test results match the stored reference results, but if any problem exists in the circuits on the board, the problem is detected by the test results and the bad boards then can be separated from the good boards.

Electronic interrogation circuits in one embodiment comprise the plurality of printed circuit cards (sometimes called "switch cards") having electronic components and printed circuits for carrying out the electronic testing. Each test probe used in the test procedure is represented as being coupled to the test electronics through a corresponding switch 24 leading to the test analyzer. In a given grid-type tester there can be as many as 40,000 switches available for testing the various test points in a board under test.

The translator fixture 14 includes a series of vertically spaced apart and parallel translator plates which may include a top plate 26, an upper plate 28 spaced a short distance below the top plate, a lower plate 30 at approximately an intermediate level of the translator fixture, and a base plate 32 at the bottom of the translator fixture. The translator plates are supported in parallel vertically spaced apart positions by rigid, integral stair-step posts 35 (also referred to as stacking towers) that hold the fixture together as a rigid unit. FIG. 1 illustrates use of four translator plates in the translator fixture; a larger number of translator plates are more commonly used and described in more detail below. The stacking towers 35 also are schematically illustrated in more detail in FIG. 2. In one embodiment, the translator fixture comprises a fixture sold under the trademark VALUGRID by Everett Charles Technologies, the assignee of this application.

The translator fixture also includes an array or standard translator pins such as tilt pins (represented schematically at 22) extending through the translator plates 26, 28, 30 and 32. FIG. 1 illustrates only a few of the standard tilt pins for simplicity. The tilt pins extending through the base plate 32 of the translator fixture are in alignment with the grid pattern of test probes 12 in the grid base 10. The top portions of the tilt pins, which extend through the top plate 26, are in an off-grid pattern aligned to match the random pattern of test points 18 on the UUT. Thus, the tilt pins can be tilted slightly in various three dimensional orientations used to translate between the grid pattern at the base and the off-grid pattern at the top. The standard tilt pins pass through holes in the base plate, through holes in the lower and upper plates, and through a hole pattern in the top plate. The holes in each of the translator plates are drilled in mostly diagonal patterns and the drill patterns are controlled by standard computer-operated software according to well-known procedures. The translator pins are retained in the fixture by an elastomeric pin retention sheet 34.

FIG. 2 schematically illustrates a translator fixture according to principles of this invention in which translator plates 42 are mounted to separate stacking towers 44 of identical construction positioned around the periphery of the fixture. FIG. 2 illustrates one embodiment of a translator fixture having eight separate translator plates identified by reference numerals 42a through 42h. In this embodiment, ten stacking towers 44 spaced apart around the periphery of the fixture support the translator plates in the fixture. The stacking towers are preferably positioned around the perimeter of the translator plates as shown in the top view of FIG. 4. Alignment holes 43 are spaced apart around the periphery of the translator plates to receive the stacking towers which are locked in place in the translator plates. This embodiment shows ten of the alignment holes 43 for positioning the corresponding group of ten stacking towers around the periphery of the translator plate.

Each stacking tower 44 comprises a rigid support member formed as an integral piece having vertically spaced apart translator plate support surfaces 46 with corresponding upright alignment posts 48 at spaced apart levels of the stacking tower. The translator plate support surfaces 46 and their corresponding alignment posts 48 have respective diameters at each level which are progressively shorter along the length of the tower to define a stair-step arrangement. The translator plates are assembled onto each stacking tower at predetermined levels in a progressive stacking sequence so that each translator plate is supported by a corresponding unique translator support surface and is retained on that surface in a fixed position by engagement with the related alignment post which extends above the corresponding support surface. The pre-drilled alignment holes 43 (shown in FIG. 4) are adapted to match the outer surface configuration or diameter of the alignment post at the level at which the translator plate is stacked. This automatically positions the translator plates at predetermined levels in the fixture supported by the related translator plate mounting surfaces. Tilt pins 47 are schematically shown extending through the assembled set of translator plates.

Each stacking tower comprises an integral molded plastic piece in which the mounting surfaces 46 are each circular in cross section and defined by a corresponding outside diameter at each level of the stacking tower. The outside diameters of the mounting surfaces are progressively wider in a direction progressing from top to bottom along the length of the tower. The intervening alignment posts 48 preferably have a cross-shaped cross-sectional configuration, and each cross is preferably aligned in an identical rotational position adjacent the other crosses so that the legs of all crosses so that the legs of all crosses extend in the same radial directions above and below one another.

In use, the translator plates are stacked over the top of each stacking tower in a predetermined sequence. Each translator plate has a corresponding unique pattern of pre-drilled holes 49 (see FIG. 4) for retaining the tilt pins 47 at a given level of the translator fixture. Each translator plate also has an identical set of pre-drilled alignment holes 43 of unique diameter for each level that matches the outside diameter of a corresponding alignment post at the same level of the stacking tower.

Each alignment hole in the translator plate 42 has corresponding diametrically opposed key slots 40 that protrude outwardly from the hole. The key slots are aligned on a diagonal axis which is askew from the parallel edges of the rectangular translator plate. The key slots are all aligned on corresponding parallel and diagonal axes. In the stacking sequence the translator plate is aligned with the stacking tower so that the shoulders that protrude from the opposite sides of the stacking tower can fit through the corresponding key slots of the particular translator plate being assembled at each level. When all translator plates in the stack are in place, the stacking towers are then rotated to an angular position that causes the plates to pass under the shoulders so that the shoulders all cooperate to hold the translator plates in position to provide a vertical restraint at each level.

A shorting plate is positioned in the fixture to correspond with the location of the test pack 52 on the lower surface of the unit under test 16 having very closely spaced test pads. Very closely spaced test pads, for example, could be spaced apart as close as 0.4 mils. As shown in FIG. 3, the shorting plate is T-shaped in cross section and includes an internal bore 53 for receiving a plug 54. A detent 56 around the perimeter of the plug receives ball plungers 58 positioned in either side of the neck portion 60 of the shorting plate 50. Ball plungers cooperate with detent 56 so that shorting plate 50 can be snapped onto plug 56. This snap fitting provides for different sized shorting plates to be utilized in the test fixture 14.

Shorting plate 50 includes an upper surface 62 dimensioned to provide an area sufficient for shorting the test pack on the printed circuit board. Consequently, the exact dimensions of the upper surface 62 can be sized to accommodate the requirements of the unit under test.

Plug 54 also includes a bore 64 for receipt of piston rod 66 of pneumatic cylinder 68. A height adjustment nut 70 is positioned between the cylinder rod 66 and the plug 54 to adjust the height at which the cylinder rod 66 can raise the shorting plate 50.

Cylinder rod 66 is attached at its lower end to a piston 72 contained within the pneumatic cylinder 68. Piston 72 is actuated by air to extend cylinder rod 66 and is retracted when the air source is removed by a removed spring 74 located within the cylinder 68. Located at the bottom of the cylinder is a threaded bore 76 for receipt of a base plug 78. Base plug 78 includes a threaded end 80, extending upwardly above shoulder 82, which screws into the threaded bore 76. Extending below shoulders 82 is a connector end 84 which extends into a bore 86 in a base receptacle 88. Connector end 84 includes a detent 90 which communicates with ball plungers 92 in base receptacle 88. Detent 90 and ball plungers 92 provide for a snap fitting between the pneumatic cylinder 68 and the base receptacle 88. A rubber O-ring 94 seals the connection between the base plug 78 and the base receptacle 88 by being positioned around a neck portion 94 of the connector end within the bore 86.

Base receptacle 88 includes mounting screw holes 96 which allows the base receptacle 88 to be rigidly secured to the base plate 42h by screws 98 as shown in FIG. 2. Base receptacle 88 further includes an air inlet fitting 100 for attachment of air hoses 102 (FIG. 4) to operate the pneumatic cylinder 68.

Located on the upper surface 62 of the shorting plate 50 is a compliant conductive media 104, preferably a layer of conductive rubber. Although resilient conductive rubber is preferred, other conductive materials are also suitable, such as metal plating.

As can be seen in FIG. 4, an air line 102 serves as a conduit for air from a gas pressure source (not shown) external to the fixture 14. Air line 102 runs along the upper surface of base plate 32 to the air inlet fitting on the base receptacle 88. Fixturing software is programmed to not drop test probes where the air line runs along the base plate. Although FIG. 4 illustrates one shorting plate 50 within the test fixture, it is to be understood that multiple shorting plates can be included in a single fixture depending upon the specific test pack requirements of the unit under test. When more than one shorting pad is required for a particular unit under test, an air line would piggyback from one base receptacle to the next in order to operate all shorting plates simultaneously.

A typical testing scenario for a test pack utilizing the fixture of the present invention would include placing the unit under test 16 on the upper surface of top plate 42a and closing the test fixture. A first test would be conducted by bringing the tilt pins 47 into contact with test pads or traces on the printed circuit board electrically connected to but outside the perimeter of the test pack. The initial test checks for shorts in the pack by testing points outside of the pack, and based on the test data, can determine if pads within the pack are improperly shorted. The initial test data are translated to the test analyzer. After the initial test is completed, the air cylinder is energized, raising the shorting plate 50 so that the compliant conductive media 102 contacts the test pack, shorting all the test pads in the pack together. A second set of test data are interpreted through the tilt pins contacting the test points on the printed circuit board electrically connected to but outside the perimeter of the pack with the results be relayed to the test analyzer. The second test determines improper shorts between the pack and test points electrically connected to the pack. The result is that the test fixture allows for high speed electronic analyzation to detect continuity or lack of continuity between the various test points in the circuits on the board without actually touching the closely spaced test points on the printed circuit board with a test pin.

What is claimed is:

1. A translator fixture for a printed circuit board tester of the type having a pattern of test probes on a base upon which the translator fixture is mounted, the translator fixture comprising:

a first translator fixture having a plurality of essentially parallel and vertically spaced apart rigid translator plates supported in a fixed position and having selected patterns of holes aligned in the translator plates for containing and supporting translator pins extending through the translator plates and positioning the translator pins for contacting test points on a first side of a printed circuit board supported in an essentially horizontal position at one end of the first translator fixture, the pins translating electrical test signals between the test points on the printed circuit board and the test probes on the base of the tester; and a second translator fixture having a plurality of essentially parallel and vertically spaced apart rigid translator plates supported in a fixed position and a retractable shorting plate located within the second translator fixture and extendable through a top plate of the second translator fixture for being pressed into shorting contact with designated test packs on a second side of the printed circuit board.

2. The translator fixture of claim 1 wherein the shorting plate includes an upper surface having a layer of conductive media for simultaneously shorting all test pads with the test pack.

3. The fixture of claim 2 wherein the conductive media is compliant rubber.

4. The fixture of claim 1 wherein the shorting plate is retractable by a pneumatic cylinder contained in the fixture.

5. The fixture of claim 4 wherein the pneumatic cylinder includes a base receptacle rigidly secured to a base plate of the fixture.

6. The fixture of claim 4 wherein the shorting plate includes a snap fitting for releasably connecting the shorting plate to the pneumatic cylinder.

7. The fixture of claim 6 wherein the snap fitting includes ball plungers in the shorting pad and a detent in a cylinder rod of the pneumatic cylinder.

8. The fixture of claim 5 wherein the pneumatic cylinder includes a snap fitting for releasably connecting the cylinder to the base receptacle.

9. The fixture of claim 8 wherein the snap fitting includes ball plungers on the base receptacle and a detent in a base plug of the pneumatic cylinder.

10. The fixture of claim 5 wherein the base receptacle includes an air inlet fitting for communication of air to the cylinder.

11. The fixture of claim 1 wherein the second translator fixture includes a plurality of shorting pads located within the second translator fixture corresponding to a plurality of test packs located on the printed circuit board.

12. The fixture of claim 1 wherein the first translator fixture includes a retractable shorting plate extendable through a top plate of the first translator fixture.

* * * * *